United States Patent
Endo et al.

(10) Patent No.: US 9,161,441 B2
(45) Date of Patent: Oct. 13, 2015

(54) GLASS CLOTH FOR PRINTED WIRING BOARD

(75) Inventors: Masaaki Endo, Tokyo (JP); Daisuke Matsude, Tokyo (JP); Susumu Ohigashi, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 296 days.

(21) Appl. No.: 13/392,461

(22) PCT Filed: Aug. 25, 2010

(86) PCT No.: PCT/JP2010/064411
§ 371 (c)(1),
(2), (4) Date: Feb. 24, 2012

(87) PCT Pub. No.: WO2011/024870
PCT Pub. Date: Mar. 3, 2011

(65) Prior Publication Data
US 2012/0156955 A1 Jun. 21, 2012

(30) Foreign Application Priority Data
Aug. 26, 2009 (JP) .................................. 2009-195873

(51) Int. Cl.
*D03D 15/00* (2006.01)
*H05K 1/03* (2006.01)
(Continued)

(52) U.S. Cl.
CPC ................. *H05K 1/0366* (2013.01); *C08J 5/24* (2013.01); *D03D 1/0082* (2013.01); *D03D 15/0011* (2013.01); *D03D 15/0094* (2013.01); *H05K 2201/029* (2013.01)

(58) Field of Classification Search
CPC ............ D03D 1/0082; D03D 15/0011; D03D 15/0094; B32B 17/00; B32B 17/02; B32B 17/04; B32B 37/065
USPC ......................................... 442/103, 203, 208
See application file for complete search history.

(56) References Cited

U.S. PATENT DOCUMENTS 5,837,624 A 11/1998 Sakaguchi et al.
2008/0271806 A1 11/2008 Fujimura et al.

FOREIGN PATENT DOCUMENTS

JP         62-86029 A     4/1987
JP         5-5243 A     1/1993
(Continued)

OTHER PUBLICATIONS

Chinese Office Action mailed Dec. 31, 2012 for Application No. 201080037734.7.
(Continued)

*Primary Examiner* — Andrew Piziali
(74) *Attorney, Agent, or Firm* — Birch, Stewart, Kolasch & Birch, LLP

(57) ABSTRACT

The present invention provides a glass cloth suitable for producing a printed wiring board to be used in the electronics and electric fields, which has small anisotropy in dimensional change and is free from warpage and twist, a prepreg using said glass cloth, and a printed wiring board using said glass cloth. The glass cloth relevant to the present invention is characterized in that the warp yarn and the weft yarn are configured with a glass yarn of $1.8 \times 10^{-6}$ kg/m to $14 \times 10^{-6}$ kg/m, a (breadth/length) ratio of an average filament diameter of said weft yarn to an average filament diameter of said warp yarn is 1.01 or more but less than 1.27, and a thickness is 10 μm to 40 μm.

10 Claims, 4 Drawing Sheets

(51) Int. Cl.
*C08J 5/24* (2006.01)
*D03D 1/00* (2006.01)

(56) References Cited

FOREIGN PATENT DOCUMENTS

| JP | 5-64857 A | 3/1993 |
|---|---|---|
| JP | 7-292543 A | 11/1995 |
| JP | 9-143837 A | 6/1997 |
| JP | 9-316749 A | 12/1997 |
| JP | 10-37038 A | 2/1998 |
| JP | 10-245743 A | 9/1998 |
| JP | 11-107111 A | 4/1999 |
| JP | 11-107112 A | 4/1999 |
| JP | 11-158752 A | 6/1999 |
| JP | 2001-73249 A | 3/2001 |
| JP | 2002-242047 A | 8/2002 |
| JP | 3324916 B2 | 9/2002 |
| JP | 2002-339191 A | 11/2002 |
| JP | 2003-171848 A | 6/2003 |
| JP | 2004-250841 A | 9/2004 |
| JP | 3578466 B2 | 10/2004 |
| JP | 2005-126862 A | 5/2005 |
| JP | 2005-213656 A | 8/2005 |
| JP | 3897789 B2 | 3/2007 |
| JP | 4200595 B2 | 12/2008 |

OTHER PUBLICATIONS

Zhu Datong, Development of Ultrathin Glass Fiber Cloths, Fiber Glass, 2006(1) (with English Abstract), pp. 27-47.
International Search Report for PCT/JP2010/064411 dated Oct. 12, 2010.

ns is not applied to# GLASS CLOTH FOR PRINTED WIRING BOARD

TECHNICAL FIELD

The present invention relates to a glass cloth for a printed wiring board to be used in the electronics and electric fields, a prepreg using said glass cloth, and a printed wiring board using said glass cloth.

BACKGROUND ART

Generally, most of printed wiring boards are produced by a method comprising: impregnating a thermosetting resin such as epoxy resin to a substrate such as glass cloth, then drying the substrate to make a prepreg; piling up single or multiple sheets of said prepreg as well as a copper foil if necessary and applying heat and pressure to make a laminate; and subsequently subjecting said laminate to a photolithography and etching treatments or plating to form a circuit pattern made of copper foil.

Further, a multilayer printed wiring board can be produced by a sequential forming method comprising: using the above-described printed wiring board as a core substrate; piling up a prepreg on a surface layer thereof, as well as further piling up a copper foil on the outside thereof; applying heat and pressure thereto to make a multilayer substrate; and subsequently forming a circuit on the surface of the multilayer substrate.

On the other hand, due to recent tendencies to high-functionality and reduction in size and weight of digital equipment, further reduction in size and thickness, as well as increase in density have also been required for the printed wiring board to be used therefor. As a means for that, increase in density is being achieved by thinning a glass cloth to be used as a substrate, as well as increasing the number of layers in a build-up multilayer printed wiring board by the sequential forming method. Under such circumstance, thickness of the glass cloth has been required to be thinned from 40 μm to 10 μm, due to the requirements of increasing in number of layers and thinning to the printed wiring board.

Generally, in the above-described production process for the printed wiring board, it has been known that dimensional change, as well as warpage and twist of a copper-clad laminate are generated by heat and pressure in the laminating step, and etching out of a part of copper foil in the circuit pattern forming step.

However, a thin glass cloth of 40 μm or less has a weak mechanical strength in the X-Y plane direction and a large anisotropy thereof compared with those of a thick glass cloth. In addition, bowed filling and yarn slippage tend to occur. For this reason, there was a problem that, in fabrication of a copper-clad laminate using a glass cloth of 40 μm or less, problems relating to the anisotropy in dimensional change, warpage and twist remarkably easily occur compared to a thick glass cloth.

As a method to enhance a mechanical strength in the X-Y plane direction and to improve an anisotropy thereof of the glass cloth, the following methods and the like have been proposed: (1) a method where reinforcement effects by stiffness of glass yarns are made equivalent by making amounts of glass to be filled, in the warp yarn direction and the weft yarn direction, equivalent, (2) a method where balance of reinforcement effects is improved by optimizing weaving density, crimp percentage, and the like, in the warp yarn direction and the weft yarn direction, (3) a method where restrictive property by yarn itself is enhanced by narrowing a distance between yarns by spreading processing.

(1) As a method where reinforcement effects by stiffness of glass yarns are made equivalent by making amounts of glass to be filled, in the warp yarn direction and the weft yarn direction, equivalent, such a method has been known that a woven fabric structure where the same kind of yarn is woven by the same weaving density both in the warp yarn direction and the weft yarn direction is employed, as disclosed in Patent Document 1 described below.

However, since a glass cloth is generally produced as a long cloth in a state where tension is applied in the warp direction, waving of the weft yarn to which tension is not applied tends to become more significant as compared with the warp yarn on which tension does not act, even if weaving is carried out using the same kind of yarns for the warp yarn and the weft yarn in the same weaving density. As a result, this causes an anisotropy in dimensional change. Also, when prepreg is produced, since resin is impregnated and dried in a state where tension acts on the warp yarn direction, and waving in the warp yarn direction is removed in some degree depending on a level of the tension, difference in waving states between the warp yarn direction and the weft yarn direction tends to become larger and difference in reinforcement effects tends to be expanded. Further, there is also the following problem. In the case of a thin glass cloth having a thickness of 40 μm or less, since glass yarn constituting the glass cloth has too small diameter and weak stiffness, influence on the anisotropy of the tension applied on the warp yarn direction in weaving and prepreg-making becomes larger together with thinning of the glass cloth, and the problem of anisotropy in dimensional change appears more significantly. Therefore, the method where amounts of glass to be filled in the warp yarn direction and the weft yarn direction are made equivalent was insufficient to improve the anisotropy in dimensional change, in particular, in the case of a thin glass cloth having a thickness of 40 μm or less.

(2) As a method where balance of reinforcement effects is improved by controlling weaving density and crimp percentage, and the like in the warp yarn direction and the weft yarn direction, the following Patent Document 2 discloses a glass cloth where a comparatively thick yarn is woven in the majority; the following Patent Documents 3 to 5 disclose a glass cloth where balance of weaving density and crimp percentage is optimized; the following Patent Document 6 discloses a glass cloth where cross-sectional shapes and waving states are made equivalent by spreading the warp yarn and the weft yarn in the same degrees; and the following Patent Documents 7 to 9 disclose a glass cloth configured with the weft yarn thicker than that of the warp yarn.

Patent Document 2 discloses a glass cloth having a high cloth weight where a thick yarn of 66 tex (filament diameter: 9 μm, filament number: 400) or more is woven as densely as 40 yarns/25 mm, improving the total reinforcement effect by increasing amount of glass.

However, since the glass cloth disclosed in Patent Document 2 weaves a thick yarn densely to obtain a high cloth weight, thickness of the glass cloth is as comparatively thick as 178 to 183 μm as disclosed in Examples 1 to 6 of Patent Document 2.

In the case of a thin glass cloth having a thickness of 40 μm or less, even when amount of glass is increased by increasing weaving density of glass yarn, it is difficult to improve dimensional stability and anisotropy thereof, because stiffness cannot be increased as much as in a thick glass cloth. In recent years, for aiming at improving stiffness of thin glass cloth having a thickness of 40 μm or less, increasing of weaving density of glass yarn have been often attempted, but it is a current situation that anisotropy of dimensional stability has not been improved yet.

Patent Documents 3 to 5 disclose a glass cloth where a yarn of filament diameter of 9 μm or 7 μm is used, distance between yarns in the warp yarn and the weft yarn is narrow, and weaving density and crimp percentage in the warp yarn direction and the weft yarn direction have been optimized, and disclose that variation by cure shrinkage of resin is reduced due to less resin amount present in the space between glass yarns, and reinforcement effects in the warp yarn direction and the weft yarn direction become equivalent because weaving shrinkage in the warp yarn direction and the weft yarn direction is set adequately.

However, thicknesses of the glass cloths in Patent Documents 3 to 5 are as comparatively thick as 90 μm or more as disclosed in Examples of these Patent Documents, because such a thick filament as filament diameter of 9 μm or 7 μm is used. Usually, when a thin glass cloth having a thickness of 40 μm or less is required, a thin filament having a filament diameter of 5 μm or less should be used. Since a thin filament having a filament diameter of 5 μm or less has a low stiffness, crimp percentage of the warp yarn tends to become smaller due to the tension exerted on the warp yarn direction in weaving, contrary a crimp percentage of the weft yarn tends to become larger, and it was difficult to optimize the crimp percentage so that reinforcement effects in the warp direction and the weft direction become equivalent.

Patent Document 6 discloses a glass cloth which is the one having a thickness of 10 μm or more but 50 μm or less, where the warp yarn and the weft yarn are configured with the same kind of yarn, and cross-sectional shapes and waving states of the warp yarn and the weft yarn are equivalent because spreading treatment is carried out under nearly a tensionless condition. It has been disclosed that in said glass cloth, a ratio of an elongation percentage of the warp yarn when a load in a range of 25 to 100 N per 25 mm width is applied in the warp yarn direction, relative to an elongation percentage of the weft yarn when said load is applied in the weft yarn direction, is 0.8 or more but 1.2 or less, and anisotropy in XY direction can be improved because elongation amounts of the warp yarn and the weft yarn are equivalent under a certain level of tensile stress.

However, even if spreading treatment is attempted in nearly a tensionless state, since not a low tension is exerted in the transporting direction (the warp yarn direction), it is difficult to make waving states of the warp yarn and the weft yarn equivalent. Even if elongation amounts of the warp yarn and the weft yarn under a tensile tension in a range of 25 to 100 N per 25 mm width can be made equivalent, it is still difficult to make the elongation percentages of the warp yarn direction and the weft yarn direction equivalent under a further lower load region (for example, 5 N), and it was not satisfactory with regard to improvement of the anisotropy in dimensional change. In addition, since physical force is exerted in nearly a tensionless state, that is, in a state where glass cloth is not held, there is also a problem that, in particular, in the case of a thin glass cloth, bowed filling and yarn slippage, and the like tend to occur, which cause warpage or twist of laminate.

Patent Document 7 discloses a glass cloth where monofilament diameter of the weft yarn is 9.5 μm or more and thicker than that of the warp yarn, weight ratio of weft yarn/warp yarn is 0.8 or more but 1.2 or less, and weight is 200 to 300 g. Patent Document 7 discloses that said glass cloth can minimize coordinate shift by using a yarn having a thick monofilament diameter, and the anisotropy can be solved without enlarging the coordinate shift by using the weft yarn having a thick monofilament diameter than that of the warp yarn.

In addition, Patent Document 8 describes a glass cloth where the warp yarn has a filament diameter of 9 and a filament number of 400, the weft yarn has a filament diameter of over 9 μm but 10.5 μm or less and a filament number of 400, a ratio of weaving density per 25 mm width of the warp yarn and the weft yarn is 1.0 to 1.4 or less, and a weight is 180 to 250 g. It has been shown that, in said glass cloth, occurrence of warpage or twist can be inhibited by using a thick yarn within the above-described range and making thicknesses of the warp yarn and the weft yarn different within the above-described range.

In addition, Patent Document 9 describes a glass cloth where count of the weft yarn is larger than that of the warp yarn, and a value of a product of count of the warp yarn and weaving density of the warp yarn divided by a product of count of the weft yarn and weaving density of the weft yarn is 0.8 or more but 1.2 or less. It has been disclosed that, in said glass cloth, a frequency of waving is reduced by increasing a count of the weft yarn, and hence reinforcement effects in the warp yarn direction and the weft yarn direction become nearly equivalent, and warpage and twist of a printed wiring board can be reduced, and that when a thick yarn of 60 tex or more is used for both of the warp yarn and the weft yarn, effect thereof becomes significant.

Patent Documents 7 to 9 disclose that the glass cloth configured with a thicker weft yarn than the warp yarn can improve dimensional stability as well as warpage and twist of a printed wiring board, but in any case, a thick yarn of 60 tex or more is used to enhance the reinforcement effect. Since glass cloth configured with a thick glass yarn tends to exhibit a large waving structure and a large elongation amount when a tensile stress is applied, dimensional change of a printed wiring board becomes significant, and therefore, it was not sufficient one in the point that variation and anisotropy in dimensional change tended to become large.

In addition, in the cases of the glass cloths described in Patent Documents 7 to 9, since a thick yarn of 60 tex or more is used as described above, thickness of a glass cloth becomes comparatively thick (glass cloths having a thickness of 188 μm in Examples 1 and 2 of Patent Document 7, 180 μm in Examples 1 to 3 of Patent Document 8, and 180 to 250 μm in Examples 1 to 5 of Patent Document 9 have been disclosed), and they were not the one which can improve dimensional stability of a thin glass cloth having a thickness of 10 to 40 μm, which was the purpose of the present application.

The glass cloths registered with ICP include, as the one in which the warp yarn is thicker than the weft yarn, 1651 (warp yarn: G 150, weft yarn: G 67, thickness: 135 μm), 2125 (warp yarn: E 225, weft yarn: G 150, thickness: 91 μm), 2157 (warp yarn: E 225, weft yarn: G 75, thickness: 130 μm), 2165 (warp yarn: E 225, weft yarn: G 150, thickness: 101 μm), 2166 (warp yarn: E 225, weft yarn: G 75, thickness: 140 μm), 7635 (warp yarn: G 75, weft yarn: G 50, thickness: 201 μm), 7642 (warp yarn: G 75, weft yarn: G 37, thickness: 254 μm), 1657 (warp yarn: G 150, weft yarn: G 67, thickness: 150 μm), 3133 (warp yarn: E 225, weft yarn: G 150, thickness: 81 μm), 3323 (warp yarn: DE 300, weft yarn: E 225, thickness: 86 μm), 7640 (warp yarn: G 75, weft yarn: G 50, thickness: 249 μm), 7669 (warp yarn: G 75, weft yarn: G 67, thickness: 178 μm), 7688 (warp yarn: G 75, weft yarn: G 67, thickness: 190 μm), 1165 (warp yarn: D 450, weft yarn: G 150, thickness: 101 μm), and 3132 (warp yarn: D 450, weft yarn: E 225, thickness: 71 μm), and all of these cloths are thick glass cloths which have a thickness of 70 μm or more using a thick filament having a diameter of 7 μm for the weft yarn. It has been known that when a glass yarn thicker than the warp yarn is used for the weft yarn, it becomes difficult to obtain a thin cloth; the cloth lacks surface smoothness; and further anisotropy in the reinforcement effects such as dimensional stability and coefficient of thermal expansion tends to occur due to different stiffness of glass yarn in warp yarn direction and weft yarn direction. It is present situation that the same glass yarns are usually used for the warp yarn and the weft yarn in a thin glass cloth having a thickness of 40 μm or less.

Besides the above, the glass cloth configured with yarns having different thicknesses for the warp yarn and the weft yarn are also disclosed in Patent Documents 10 to 15 described below, but none of the above glass cloths could not improve dimensional stability and anisotropy thereof.

(3) The glass cloth where restrictive property by yarn itself is enhanced by narrowing a distance between yarns by spreading processing has been disclosed in Patent Documents 16 to 19 described below. In the glass cloths disclosed in these Patent Literatures, an effect of the dimensional stability can be obtained because a gap between glass yarns is narrow and variation thereof is also small, and therefore cure shrinkage of the resin present in said gap is reduced, and contact area of the warp yarn and the weft yarn is large and hence resistance to the cure shrinkage is large.

However, since mechanical strength and elongation characteristics of the warp yarn and the weft yarn are influenced by stiffness of the yarn and waving state, sufficient effect for improving anisotropy in dimensional change rate could not be obtained only by narrowing the gap between yarns by spreading treatment.

As described above, a glass cloth having a thickness of 40 μm or less which allows to produce a printed wiring board having a small anisotropy in dimensional change and being free from warpage and twist with good accuracy, has not been obtained until now, and such glass cloth has been strongly demanded.

PRIOR ART DOCUMENTS

Patent Documents

Patent Document 1: JP-A-62-86029
Patent Document 2: JP-A-11-158752
Patent Document 3: JP-A-9-316749
Patent Document 4: JP-A-10-37038
Patent Document 5: JP-A-11-107112
Patent Document 6: JP No. 3897789
Patent Document 7: JP-A-5-64857
Patent Document 8: JP-A-5-5243
Patent Document 9: JP-A-7-292543
Patent Document 10: JP-A-10-245743
Patent Document 11: JP-A-2005-126862
Patent Document 12: JP No. 3324916
Patent Document 13: JP-A-2003-171848
Patent Document 14: JP-A-2002-339191
Patent Document 15: JP-A-9-143837
Patent Document 16: JP No. 4200595
Patent Document 17: JP-A-2005-213656
Patent Document 18: JP No. 3578466
Patent Document 19: JP-A-11-107111

SUMMARY OF INVENTION

Problem to be Solved by the Invention

Under the aforementioned situation, the problem to be solved by the present invention is to provide a glass cloth having a thickness of 40 μm or less which enables reduction of anisotropy in dimensional change, warpage and twist of a printed wiring board, a prepreg using said glass cloth, as well as a printed wiring board using said prepreg.

Means for Solving the Problem

The present inventors have intensively studied to solve such problem focusing attention on the effect of woven fabric structure of a glass cloth configured with the warp yarn and the weft yarn on the dimensional change of a printed wiring board. After repeating experiments, the present inventors have found that by using glass yarn having larger filament diameter than that of the warp yarn as the weft yarn and setting a ratio of filament diameters thereof within a specified range, strain under tension load and a breadth/length ratio thereof fall within a specified ranges, and that the anisotropy in elongation percentages in the warp yarn direction and the weft yarn direction can be improved even in the case of a thin glass cloth having a thickness of 40 μm or less. The present invention has been completed based on such knowledge.

That is, the present invention has the following aspects.

[1] A glass cloth characterized in that the warp yarn and the weft yarn are configured with a glass yarn of $1.8 \times 10^{-6}$ kg/m to $14 \times 10^{-6}$ kg/m, a (breadth/length) ratio of an average filament diameters of said weft yarn to an average filament diameter of said warp yarn is 1.01 or more but less than 1.27, and a thickness is 10 μm to 40 μm.

[2] The glass cloth according to the aforementioned [1], wherein the warp yarn and the weft yarn are configured with a glass yarn of $1.8 \times 10^{-6}$ kg/m to $8 \times 10^{-6}$ kg/m.

[3] The glass cloth according to the aforementioned [1] or [2], wherein a (breadth/length) ratio of an average filament diameter of the weft yarn relative to an average filament diameter of the warp yarn is 1.01 to 1.20 (inclusive).

[4] The glass cloth according to any one of the aforementioned [1] to [3], wherein a (breadth/length) ratio of a filament number of the weft yarn relative to a filament number of the warp yarn is 0.8 to 1.2 or less.

[5] The glass cloth according to any one of the aforementioned [1] to [4], wherein a (breadth/length) ratio of a volume of the weft yarn to a volume of the warp yarn is 0.75 to 1.15 (inclusive).

[6] The glass cloth according to any one of the aforementioned [1] to [5], wherein an elongation percentage in the weft yarn direction generated when a load of 5 N per 25 mm width of glass cloth is exerted in the weft yarn direction and an elongation percentage in the warp yarn direction generated when said load is exerted in the warp yarn direction are both 0.25% or less, and a ratio (breadth/length ratio) of an elongation percentage in the weft yarn direction relative to an elongation percentage in the warp yarn direction is 0.5 to 1.3 (inclusive).

[7] A prepreg for printed wiring board, comprising the glass cloth according to any one of the aforementioned [1] to [6] and a matrix resin in a partially-cured state.

[8] A printed wiring board prepared using the prepreg for the printed wiring board according to the aforementioned [7].

Effect of Invention

According to the present invention, a glass cloth having a thickness of 40 μm or less, which has an improved anisotropy in elongation percentages in the warp yarn direction and the weft yarn direction and a small bowed filling and yarn slippage, can be provided. Also, by using said glass cloth, a thin type printed wiring board having a small anisotropy in dimensional change and being free from warpage or twist can be provided.

DETAILED DESCRIPTION OF DRAWINGS

EMBODIMENTS FOR CARRYING OUT THE INVENTION

Figure 1:
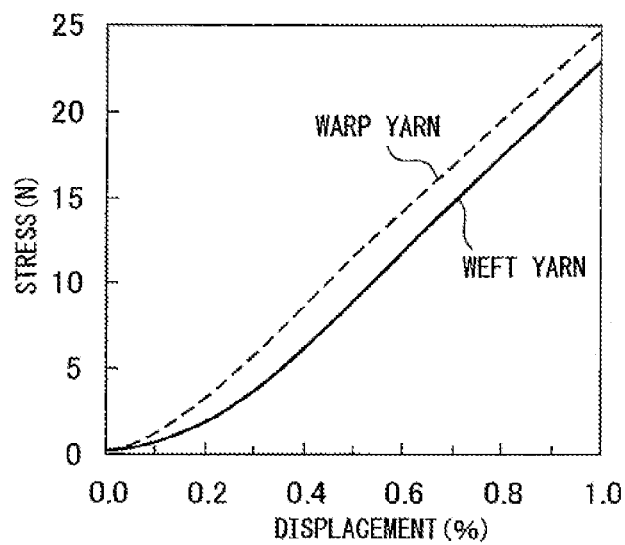
FIG. 1 is a graph showing measurement results on elongation characteristics of 1000 type.
Figure 2:
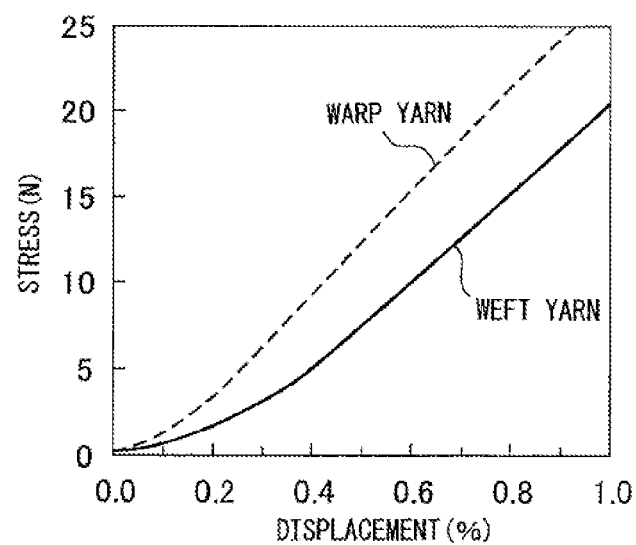
FIG. 2 is a graph showing measurement results on elongation characteristics of 1017 type.
Figure 3:
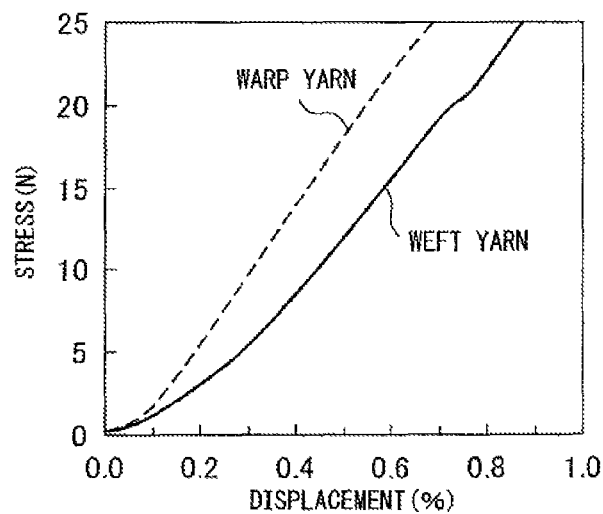
FIG. 3 is a graph showing measurement results on elongation characteristics of 1027 type.
Figure 4:
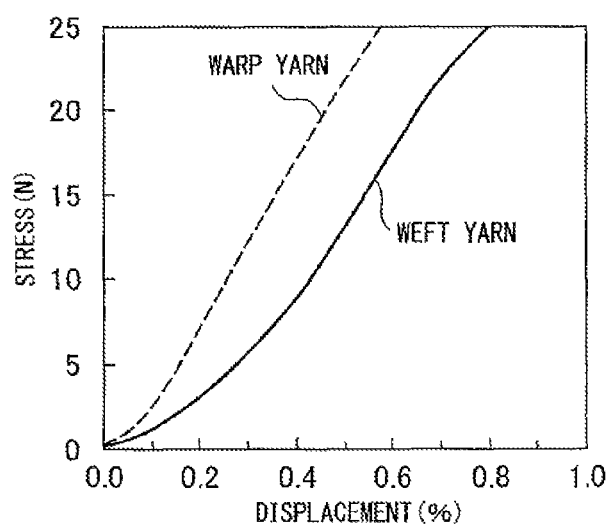
FIG. 4 is a graph showing measurement results on elongation characteristics of 1037 type.
Figure 5:
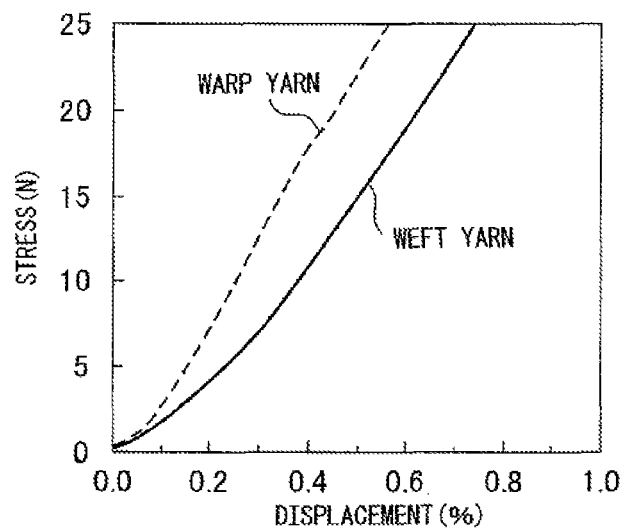
FIG. 5 is a graph showing measurement results on elongation characteristics of 1067 type.

Hereinafter, the present invention will be explained in detail.

In order to reduce the dimensional change of a printed wiring board and make the length/breadth anisotropy thereof smaller, a method is effective where resistance against tensile stress of the glass cloth as a reinforcing material is enhanced and at the same time the length/breadth anisotropy thereof is made smaller. Since the glass cloth has a woven fabric structure, it has a characteristic feature to be elongated to a tension in one direction in the X-Y plane, and an elongation amount largely depends on the reinforcement effect derived from stiffness of the glass yarn as a constituent, as well as waving state of the glass yarn. Therefore, it can be said to be one method to improve dimensional stability of the printed wiring board to adjust a balance between stiffness of a glass yarn constituting the glass cloth and waving of the yarn and optimize elongation characteristics in X-Y plane.

FIGS. 1 to 5 show measurement results of elongation characteristics for 1000 (thickness: 12 μm), 1017 (thickness: 14 μm), 1027 (thickness: 19 μm), 1037 (thickness: 27 μm), and 1067 (thickness: 35 μm) which are glass cloths popularly utilized for printed wiring board as a conventional thin glass cloth. It should be noted that the thin glass cloths having a thickness of 40 μm or less represented by these are configured with a thin yarn having a filament diameter of 5 μm or less, and both of the warp yarn and the weft yarn are configured with a glass yarn having the same filament diameter. This is because of the intentions such as: (1) to obtain a thin glass cloth by using a thin yarn for both of the warp yarn and the weft yarn (when the warp yarn and the weft yarn have different diameters from each other, thickness of the glass cloth is influenced by a thicker yarn and becomes thick); (2) to improve surface smoothness; (3) to make reinforcement effects in the warp yarn direction and the weft yarn direction such as dimensional stability and coefficient of thermal expansion equivalent by using a glass yarn having the same stiffness for the warp yarn and the weft yarn; and the like.

As obvious from FIGS. 1 to 5, the conventional glass cloths have a feature that elongation in the weft yarn direction becomes larger than that in the warp yarn direction when the same tension load is exerted, and the ratio thereof for 1000, 1017, 1027, 1037 and 1067 type under a load of 5 N is as high as 1.31, 1.50, 1.44, 1.79 and 1.50, respectively. This is derived from the fact that the waving state of the weft yarn is more remarkable than that of the warp yarn although the same glass yarn is used for the warp yarn and the weft yarn in the conventional glass cloths. Such difference in waving state occurs because the warp yarn is difficult to exhibit waving because it is held by a tension during weaving, while the weft yarn exhibit more remarkable waving in compensation for the less waving of the warp yarn due to a tension to be held, as described above. That is, the conventional glass cloth has a feature that elongation occurs more easily in the weft yarn direction under the same tensile stress. For this reason, there was a problem that reinforcement effect in the weft yarn direction for dimensional change tended to become weak during fabrication step of printed wiring board to cause the anisotropy in dimensional change.

Figure 6:
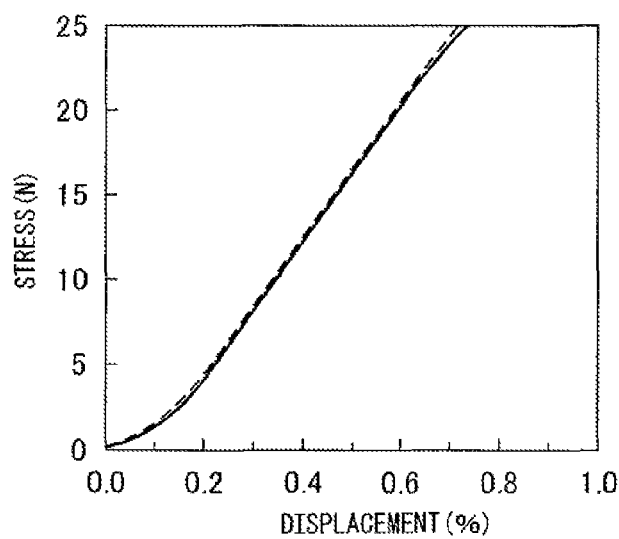
FIG. 6 is a graph showing measurement results on elongation characteristic of Example 3 (glass cloth C).
Figure 7:
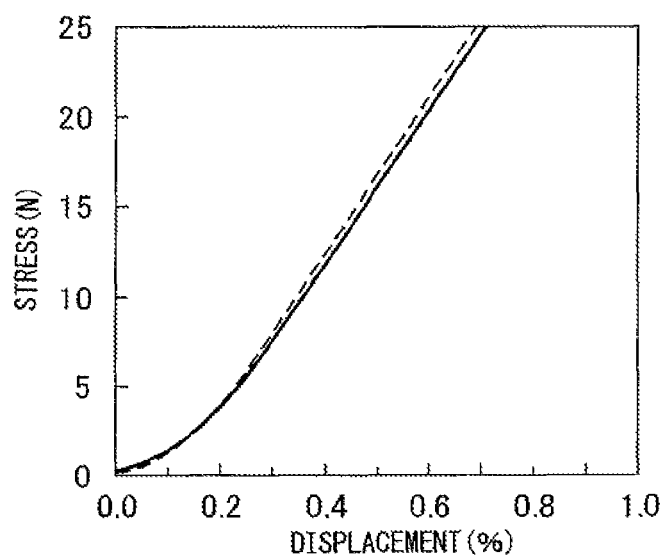
FIG. 7 is a graph showing measurement results on elongation characteristics of Example 8 (glass cloth H).

Contrary to the conventional thin glass cloth, the thin glass cloth of the present invention has a feature that elongation percentage in the weft yarn direction is as low as roughly equivalent to the elongation percentage in the warp yarn direction, and a preferable (breadth/length) ratio of an elongation percentage in the weft yarn direction relative to an elongation percentage in the warp yarn direction is 0.5 to 1.3 (inclusive). A preferable range of the (breadth/length) ratio of an elongation percentage in the weft yarn direction relative to an elongation percentage in the warp yarn direction is 0.6 to 1.2 (inclusive), and more preferable range is 0.7 to 1.1 (inclusive). FIGS. 6 and 7 show measurement results of elongation characteristics for the glass cloths of Example 3 (thickness: 19 μm) and Example 8 (thickness: 29 μm) as examples of the glass cloth of the present invention. Their (breadth/length) ratios of an elongation percentage in the weft yarn direction relative to an elongation percentage in the warp yarn direction are 1.09 and 1.06, respectively, and elongation characteristics in the warp yarn and the weft yarn directions are equivalent.

Here, elongation percentage is a value calculated in the following way.

Elongation amount when a tension is exerted on a glass cloth in the warp yarn direction or the weft yarn direction is measured according to the method described in the item of JIS R3420 General testing methods of glass tests, 7.4, Tensile strength. In said method defined by JIS, a test piece having a width of about 30 mm and a length of about 250 mm is taken from the warp yarn direction and the weft yarn direction. The yarns in both edges of said test piece are detangled to adjust the width at about 25 mm. The test piece is fixed to grip section with securing about 150 mm of distance between grips, and pulled at a tension speed of about 200 mm/min to obtain a load at break. In the present invention, the tensile test was carried out under the same conditions as in the above-described method defined by JIS, except that tension speed: about 10 mm/min, width of test piece to be collected: about 35 mm, length: about 175 mm, and distance between grips: 75 mm were employed to improve measurement accuracy. An amount of displacement when a load of 5 N per 25 mm width of glass cloth was applied was measured, and the value calculated using the following equation (1):

Elongation percentage={(distance under load−distance under no load)/distance under no load}× 100 was defined as "elongation percentage".

It is preferable that the (breadth/length) ratio of an elongation percentage in the weft yarn direction relative to an elongation percentage in the warp yarn direction is in the above-described range, because reinforcement effects in the warp yarn direction and the weft yarn direction become equivalent, and isotropy in dimensional shrinkage ratio of laminates can be secured.

In addition, the thin glass cloth of the present invention also has a feature that both of elongation percentages in the weft yarn direction and the warp yarn direction are low. Both of elongation percentages in the weft yarn direction and the warp yarn direction are preferably 0.25% or less, more preferably 0.24% or less, and further more preferably 0.23% or less. It is preferable that both of elongation percentages in the weft yarn direction and the warp yarn direction are 0.25% or less, because dimensional change of printed wiring board can be kept low both in the weft yarn direction and the warp yarn direction. Lower elongation percentage in the weft yarn direction or in the warp yarn direction is preferable because dimensional change of printed wiring board can be kept lower, but lower limit thereof is at most 0.1%, as long as glass cloth has a woven structure.

Next, the thin glass cloth of the present invention having the above-described characteristics will be explained.

Firstly, the glass cloth of the present invention has a thickness of 10 μm to 40 μm. It is preferable that thickness of the glass cloth is thinner than 40 μm, because printed wiring board having a desired thickness can be obtained. From the viewpoint of strength, thickness of the glass cloth is preferably thicker than 10 μm. It is preferable that thickness is in a range of 10 μm or more but 40 μm or less, because a glass cloth which has a problem-free strength in the practical use and meets the requirements for a thinner printed wiring board can be obtained.

Next, the warp yarn and the weft yarn constituting the glass cloth of the present invention are a glass yarn of $1.8 \times 10^{-6}$ kg/m to $14 \times 10^{-6}$ kg/m, preferably $2.2 \times 10^{-6}$ kg/m to $8.0 \times 10^{-6}$ kg/m, and further more preferably $2.9 \times 10^{-6}$ kg/m to $6.0 \times 10^{-6}$ kg/m. It is preferable that the warp yarn and the weft yarn constituting the glass cloth is less than $14 \times 10^{-6}$ kg/m, because weaving density can be increased even in the case of a glass cloth having a thickness of 40 μm or less, and as a result, a glass cloth having a small bowed filling or yarn slippage can be obtained, and the like. Lower weight per unit length of the warp yarn and the weft yarn is preferable because weaving density can be increased and bowed filling and yarn slippage become difficult to occur, but from the viewpoint of strength of the glass cloth, the weight per unit length is preferably $1.8 \times 10^{-6}$ kg/m or more. It is preferable that the glass cloth is configured with the warp yarn and the weft yarn of a glass yarn of $1.8 \times 10^{-6}$ kg/m to $14 \times 10^{-6}$ kg/m, because a glass cloth having a thickness of 40 μm or less which has a small bowed filling or yarn slippage as well as a suitable strength for practical use.

Further, a (breadth/length) ratio of an average filament diameter of the weft yarn relative to an average filament diameter of the warp yarn is 1.01 or more but less than 1.27, preferably 1.05 or more but less than 1.20, more preferably 1.07 or more but less than 1.17. It is preferable that a (breadth/length) ratio of an average filament diameter of the weft yarn relative to an average filament diameter of the warp yarn is 1.01 or more, because stiffness of the weft yarn becomes higher than that of the warp yarn, and hence waving of the warp yarn which is held by a tension and waving of the weft yarn which is under no tension in weaving process become equivalent, as a result, mechanical strengths in the warp yarn direction and the weft yarn direction become equivalent and the glass cloth becomes isotropic. It is also preferable that a (breadth/length) ratio of an average filament diameter of the weft yarn relative to an average filament diameter of the warp yarn is less than 1.27, because mechanical strength of the weft yarn becomes equivalent to that of the warp yarn due to appropriately large ratio of a stiffness of the weft yarn and a stiffness of the warp yarn, and a laminate to be obtained can have superior isotropy in dimensional stability. It is preferable that a (breadth/length) ratio of an average filament diameter of the weft yarn relative to an average filament diameter of the warp yarn is in a range of 1.01 1.27 (inclusive), because increase of stiffness and reduction of waving in the weft yarn as well as increase of waving in the warp yarn become appropriate, and mechanical strength of the weft yarn becomes equivalent to or more than that of the warp yarn within a range where a laminate to be obtained can maintain an isotropy in dimensional stability.

In addition, a (breadth/length) ratio of a filament number of the weft yarn relative to that of the warp yarn constituting the glass cloth of the present invention is preferably 0.8 to 1.2 (inclusive), more preferably 0.85 to 1.15 (inclusive), and further more preferably 0.9 to 1.0 (inclusive). It is preferable that the ratio of filament numbers is 0.8 to 1.2 (inclusive), because anisotropy in dimensional change of printed wiring board can be improved without over-enhancing of reinforcement effect of the warp yarn or the weft yarn, and a glass cloth having a superior surface smoothness can be obtained.

Further, since thickness of glass cloth becomes thinner when filaments are less distributed in the Z direction within a yarn bundle, yarn bundle is preferably in a state where a yarn is sufficiently widened. To that end, less filament number of a yarn bundle is more preferable, but at least 50 filaments are necessary to be handled as a glass yarn. Therefore, in order to configure a thin glass cloth with a yarn bundle being sufficiently widened, filament number of the glass yarn is preferably 50 to 204 (inclusive), and more preferably around 102.

Further, a (breadth/length) ratio of a volume of the weft yarn relative to that of the warp yarn is preferably 0.75 to 1.15 (inclusive), more preferably 0.80 to 1.10 (inclusive), and further more preferably 0.85 to 1.05 (inclusive). It is preferable that the (breadth/length) ratio of a volume of the weft yarn relative to that of the warp yarn is in a range of 0.75 to 1.15 (inclusive), because increase of stiffness and reduction of waving in the weft yarn as well as increase of waving in the warp yarn become appropriate, and mechanical strength of the weft yarn becomes equivalent to or more than that of the warp yarn within a range where a laminate to be obtained can maintain an isotropy in dimensional stability.

Further, in the glass cloth of the present invention, a (length/breadth) ratio of a weaving density in the warp yarn relative to that in the weft yarn is preferably 1.01 to 1.65 (inclusive), more preferably 1.08 to 1.55 (inclusive), and further more preferably 1.1 to 1.5 (inclusive). It is preferable that the (length/breadth) ratio of a weaving density in the warp yarn relative to that in the weft yarn is in a range of 1.01 or more but 1.65 (inclusive), because reduction of waving in the weft yarn and increase of waving in the warp yarn become appropriate, and reinforcement effects in the warp yarn direction and the weft yarn direction become equivalent.

In addition, in the glass cloth of the present invention, it is preferable to carry out a flattening processing of the constituting yarn by executing spreading treatment or the like. Flattening processing is preferable, because it works in a direction where amount of glass to be filled can be comparatively increased without making a thickness of glass cloth thicker, and hence stiffness of the whole glass cloth is improved and anisotropy in dimensional shrinkage is reduced.

Spreading treatment includes, for example, spreading by water stream pressure, spreading by high-frequency vibration using a liquid as a medium, processing by fluid pressure having contact pressure, processing by compressing with a roll, and the like. Among these spreading treatment methods, spreading by water stream pressure or spreading by high-frequency vibration using a liquid as a medium is more preferable because of uniformity. In addition, in order to enhance an effect of the flattening processing, it is preferable to carry out the spreading treatment or the like in a state where a tension exerted on the glass class for conveyance is reduced.

Further, it is preferable that the flattening processing is carried out with a glass cloth in a state where an organic substance exhibiting lubricating nature is attached to the glass yarn, or a binder, a sizing agent or the like to be used in weaving usual glass cloth are attached thereto (hereinafter, referred to as grey fabric), or by combining these techniques, because thickness of glass cloth can be reduced effectively and amount of glass to be filled can be increased without increasing thickness of glass cloth. In addition, a gap between focused filaments can be further expanded by treating with the spreading, then subjecting to surface treatment with a silane coupling agent described below and further subjecting to the spreading treatment.

Here, in a state where yarn bundle is widened by the spreading treatment, since impregnating ability of a resin varnish is improved and hence glass and matrix resin become more uniform, an advantage that heat resistance and the like are improved can be obtained. In addition, the spreading is preferable because glass yarns are distributed more uniformly and an advantage that laser processing ability (uniformity of hole diameter distribution, processing speed, and the like) is improved can be also obtained.

The glass yarn constituting the glass cloth of the present invention is not particularly limited, and E glass (alkali-free glass) which is commonly used for the printed wiring board use may be used, or low-permittivity glass such as D glass, L glass, NE glass, high-intensity glass such as S glass, T glass, high-permittivity glass such as H glass, or the like may be used.

In addition, laminated glass cloths to be used for printed wiring board and the like, is usually subjected to a surface treatment with a treatment liquid containing a silane coupling agent. As said silane coupling agent, a silane coupling agent which is generally used can be used, and acid, dye, pigment, surfactant, and the like may be added thereto if necessary.

Prepreg using the glass cloth of the present invention can be produced according to a common method. For example, a resin-impregnated prepreg may be produced by impregnating a varnish obtained by diluting a matrix resin such as epoxy resin with an organic solvent to the glass cloth of the present invention, then volatilizing the organic solvent in a drying furnace to cure the thermosetting resin to a B-stage state (partially-cured state). On this occasion, it is more preferable to exert the least tension because a prepreg having more superior dimensional stability can be obtained.

The matrix resin includes, besides the above-described epoxy resin, thermosetting resin such as unsaturated polyester resin, polyimide resin, BT resin, cyanate resin; thermoplastic resin such as PPO resin, polyetherimide resin, fluororesine; or resin mixture thereof; and the like. In addition, a resin in which an inorganic filler such as aluminum hydroxide has been blended may be used.

In addition, the printed wiring board using the prepreg of the present invention can be produced according to a usual method. For example, a double-sided printed wiring board can be produced through a step where a copper-clad laminate is prepared by laminating a single or multiple layers of the prepregs of the present invention, pasting copper foil on the both sides of the obtained laminate, and curing by heating and compressing; a step where a circuit pattern made of the copper foil is prepared on the both sides of said copper-clad laminate; and then a step where an electric connection between said circuit patterns on the both sides is secured by forming a through-hole.

Further, such a method and the like can be suitably used where a multilayer printed wiring board is made by preparing an inter-connecting prepreg for IVH connection by forming IVH by laser hole-drilling and then filling up IVH with a conductive paste, piling up said inter-connecting prepreg together with a double-sided printed wiring board or a double-sided conductive wiring sheet alternately, and subjecting to heat and pressure molding.

As the molding conditions in this case, heating temperature is preferably 100 to 230° C., and pressure is preferably 1 to 5 MPa, and time to be kept under these conditions is preferably 0.5 to 2.0 hours.

As for a method of IVH processing by laser to the prepreg of the present invention, a processing method by carbon dioxide gas laser, YAG laser, excimer laser, or the like can be appropriately used. In addition, an organic film or the like may be used by being laminated before or after the heating and compressing or IVH processing by laser, for the purpose of protection or improvement of processability of the prepreg. As an organic film in this case, polyethylene terephthalate film, polypropylene film, polyethylene film, polyfluoroethylene film, and the like can be used.

In addition, when a conductive paste is filled into the formed IVH, a known conductive paste of various materials such as copper, silver can be used.

EXAMPLES

Hereinafter, the present invention is explained specifically by means of Examples.

Physical properties of the glass cloths in Examples and Comparative Examples were measured according to JIS R3420. It should be noted that elongation percentage in the warp yarn direction and elongation percentage in the weft yarn direction were measured according to the above-described method which was modified from JIS R3420.

Example 1

A glass cloth was woven using a glass yarn of average filament diameter: 4.0 μm, filament number: 100, twist number: 1.0 Z, weight per unit length: $3.4 \times 10^{-6}$ kg/m for the warp yarn, and a glass yarn of average filament diameter: 4.5 μm, filament number: 100, twist number: 1.0 Z, weight per unit length: $4.2 \times 10^{-6}$ kg/m for the weft yarn, by an air jet loom at a weaving density of 75 yarns/25 mm for the warp yarn and 40 yarns/25 mm for the weft yarn. The resultant grey fabric was subjecting to desizing by heat treatment at 400° C. for 24 hours. Subsequently, the glass cloth was dipped in a treatment liquid using SZ 6032 (produced by Dow Corning Toray Co., Ltd.) as a silane coupling agent, and after squeezing the liquid, dried at 120° C. for 1 minute, and then subjected to spreading processing by columnar stream, to obtain glass cloth A having weight of 15 g/m$^2$ and thickness of 17 μm. Elongation percentages in the warp yarn direction and the weft yarn direction of glass cloth A at 5 N point were 0.21% and 0.25%, respectively, and a (breadth/length) ratio of an elongation percentage in the weft yarn direction relative to an elongation percentage in the warp yarn direction was 1.30, which showed superior isotropy.

An epoxy resin varnish was prepared as a matrix resin by blending 80 parts by weight of low-brominated bisphenol A type epoxy resin (1121N-80M, produced by DIC Corp.), 20 parts by weight of cresol novolac type epoxy resin (N680-

75M produced by DIC Corp.), 2 parts by weight of dicyandiamide, 0.2 part by weight of 2-ethyl-4-methylimidazole, and 200 parts by weight of 2-methoxyethanol. Glass cloth A was dipped in said epoxy resin varnish, after scraping off the excess varnish through a slit, dried at 125° C. for 10 minutes in an oven to partially cure (B stage) said epoxy resin, to obtain prepreg A. Said prepreg A was cut into a size of 340 mm×340 mm, subsequently copper foil having a thickness of 12 μm was arranged on the both surfaces thereof, and then the prepreg was subjected to compression molding at 175° C. and 40 kgf/cm², to obtain substrate A.

On the resultant substrate A, gauge points were marked at 9 points in total of 3 points in the warp yarn direction×3 points in the weft yarn direction so that each distance became 125 mm. Gauge point distances between adjacent two gauge points were measured at 6 places (measured value a) for each of the warp and the weft directions. Subsequently, copper foil was removed by etching treatment, and after heating at 170° C. for 30 minutes, said gauge point distances were measured again (measured value b). A ratio of a difference between measured value "a" and measured value "b" relative to measured value "a" was calculated, and an average value of the 6 values was defined as dimensional change rate (%) for the warp yarn direction and the weft yarn direction.

Dimensional change rates of substrate A were −0.021% for the warp yarn direction and −0.042% for the weft yarn direction, and both of dimensional change rate and anisotropy between the warp yarn direction and the weft yarn direction were small.

Example 2

Weaving of a glass cloth and subsequent treatment were carried out in the same manner as in Example 1, except that weaving density of the weft yarn was set at 48 yarns/25 mm, to obtain glass cloth B having weight of 18 g/m² and thickness of 18 μm. Elongation percentages in the warp yarn direction and the weft yarn direction of glass cloth B at 5 N point were 0.20% and 0.24%, respectively, and a (breadth/length) ratio of an elongation percentage in the weft yarn direction to an elongation percentage in the warp yarn direction was 1.20, which showed superior isotropy.

Subsequently, preparation of substrate B and measurement of dimensional change rate were carried out in the same manner as in Example 1. Dimensional change rates of substrate B were −0.014% for the warp yarn direction and −0.035% for the weft yarn direction, and both of dimensional change rate and anisotropy between the warp yarn direction and the weft yarn direction were small.

Example 3

Weaving of a glass cloth and subsequent treatment were carried out in the same manner as in Example 1, except that weaving density of the weft yarn was set at 60 yarns/25 mm, to obtain glass cloth C having weight of 20 g/m² and thickness of 19 μm. Elongation percentages in the warp yarn direction and the weft yarn direction of glass cloth B at 5 N point were 0.21% and 0.22%, respectively, and a (breadth/length) ratio of an elongation percentage in the weft yarn direction to an elongation percentage in the warp yarn direction was 1.09, which showed superior isotropy.

Subsequently, preparation of substrate C and measurement of dimensional change rate were carried out in the same manner as in Example 1. Dimensional change rates of substrate C were −0.016% for the warp yarn direction and −0.031% for the weft yarn direction, and both of dimensional change rate and anisotropy between the warp yarn direction and the weft yarn direction were small.

Example 4

Weaving of a glass cloth and subsequent treatment were carried out in the same manner as in Example 1, except that weaving density of the weft yarn was set at 67 yarns/25 mm, to obtain glass cloth D having weight of 21 g/m² and thickness of 21 μm. Elongation percentages in the warp yarn direction and the weft yarn direction of glass cloth B at 5 N point were 0.21% and 0.20%, respectively, and a (breadth/length) ratio of an elongation percentage in the weft yarn direction to an elongation percentage in the warp yarn direction was 0.95, which showed superior isotropy.

Subsequently, preparation of substrate D and measurement of dimensional change rate were carried out in the same manner as in Example 1. Dimensional change rates of substrate D were −0.018% for the warp yarn direction and −0.025% for the weft yarn direction, and both of dimensional change rate and anisotropy between the warp yarn direction and the weft yarn direction were small.

Example 5

Weaving of a glass cloth and subsequent treatment were carried out in the same manner as in Example 1, except that weaving density of the weft yarn was set at 72 yarns/25 mm, to obtain glass cloth E having weight of 23 g/m² and thickness of 25 μm. Elongation percentages in the warp yarn direction and the weft yarn direction of glass cloth B at 5 N point were 0.23% and 0.18%, respectively, and a (breadth/length) ratio of an elongation percentage in the weft yarn direction to an elongation percentage in the warp yarn direction was 0.78, which showed superior isotropy.

Subsequently, preparation of substrate E and measurement of dimensional change rate were carried out in the same manner as in Example 1. Dimensional change rates of substrate E were −0.019% for the warp yarn direction and −0.029% for the weft yarn direction, and both of dimensional change rate and anisotropy between the warp yarn direction and the weft yarn direction were small.

Example 6

Weaving of a glass cloth and subsequent treatment were carried out in the same manner as in Example 1, except that a glass yarn having average filament diameter: 4.5 μm, filament number: 50, twist number: 1.0 Z, and weight per unit length: $2.1 \times 10^{-6}$ kg/m was used for the weft yarn and weaving density of the weft yarn was set at 135 yarns/25 mm, to obtain glass cloth F having weight of 19 g/m² and thickness of 21 μm. Elongation percentages in the warp yarn direction and the weft yarn direction of glass cloth F at 5 N point were 0.20% and 0.25%, respectively, and a (breadth/length) ratio of an elongation percentage in the weft yarn direction to an elongation percentage in the warp yarn direction was 1.25, which showed superior isotropy.

Subsequently, preparation of substrate E and measurement of dimensional change rate were carried out in the same manner as in Example 1. Dimensional change rates of substrate E were −0.024% for the warp yarn direction and −0.044% for the weft yarn direction, and both of dimensional change rate and anisotropy between the warp yarn direction and the weft yarn direction were small.

Example 7

Weaving of a glass cloth and subsequent treatment were carried out in the same manner as in Example 1, except that a glass yarn having average filament diameter: 4.5 μm, filament number: 200, twist number: 1.0 Z, and weight per unit length: 8.4×10⁻⁶ kg/m was used for the weft yarn and weaving density of the weft yarn was set at 33 yarns/25 mm, to obtain glass cloth G having weight of 21 g/m² and thickness of 38 μm. Elongation percentages in the warp yarn direction and the weft yarn direction of glass cloth G at 5 N point were 0.24% and 0.29%, respectively, and a (breadth/length) ratio of an elongation percentage in the weft yarn direction to an elongation percentage in the warp yarn direction was 0.79, which showed superior isotropy.

Subsequently, preparation of substrate G and measurement of dimensional change rate were carried out in the same manner as in Example 1. Dimensional change rates of substrate G were −0.026% for the warp yarn direction and −0.033% for the weft yarn direction, and both of dimensional change rate and anisotropy between the warp yarn direction and the weft yarn direction were small.

Example 8

Weaving of a glass cloth and subsequent treatment were carried out in the same manner as in Example 1, except that a glass yarn having average filament diameter: 4.5 μm, filament number: 100, twist number: 1.0 Z, and weight per unit length: 4.2×10⁻⁶ kg/m for the warp yarn and a glass yarn having average filament diameter: 5.0 μm, filament number: 100, twist number: 1.0 Z, and weight per unit length: 5.6×10⁻⁶ kg/m for the weft yarn were used and weaving density of the warp yarn and the weft yarn were set at 70 yarns/25 mm and 58 yarns/25 mm, respectively, to obtain glass cloth H having weight of 24 g/m² and thickness of 27 μm. Elongation percentages in the warp yarn direction and the weft yarn direction of glass cloth H at 5 N point were 0.23% and 0.24%, respectively, and a (breadth/length) ratio of an elongation percentage in the weft yarn direction to an elongation percentage in the warp yarn direction was 1.06, which showed superior isotropy.

Subsequently, preparation of substrate H and measurement of dimensional change rate were carried out in the same manner as in Example 1. Dimensional change rates of substrate H were −0.034% for the warp yarn direction and −0.039% for the weft yarn direction, and both of dimensional change rate and anisotropy between the warp yarn direction and the weft yarn direction were small.

Example 9

Weaving of a glass cloth and subsequent treatment were carried out in the same manner as in Example 1, except that weaving density of the warp yarn and the weft yarn were set at 90 yarns/25 mm and 63 yarns/25 mm, respectively, to obtain glass cloth I having weight of 28 g/m² and thickness of 28 μm. Elongation percentages in the warp yarn direction and the weft yarn direction of glass cloth I at 5 N point were 0.17% and 0.18%, respectively, and a (breadth/length) ratio of an elongation percentage in the weft yarn direction to an elongation percentage in the warp yarn direction was 1.06, which showed superior isotropy.

Subsequently, preparation of substrate G and measurement of dimensional change rate were carried out in the same manner as in Example 1. Dimensional change rates of substrate G were −0.007% for the warp yarn direction and −0.009% for the weft yarn direction, and both of dimensional change rate and anisotropy between the warp yarn direction and the weft yarn direction were small.

Example 10

Weaving of a glass cloth and subsequent treatment were carried out in the same manner as in Example 9, except that weaving density of the weft yarn was set at 73 yarns/25 mm, to obtain glass cloth J having weight of 30 g/m² and thickness of 29 μm. Elongation percentages in the warp yarn direction and the weft yarn direction of glass cloth J at 5 N point were 0.19% and 0.16%, respectively, and a (breadth/length) ratio of an elongation percentage in the weft yarn direction to an elongation percentage in the warp yarn direction was 0.84, which showed superior isotropy.

Subsequently, preparation of substrate J and measurement of dimensional change rate were carried out in the same manner as in Example 9. Dimensional change rates of substrate J were −0.003% for the warp yarn direction and −0.012% for the weft yarn direction, and both of dimensional change rate and anisotropy between the warp yarn direction and the weft yarn direction were small.

Example 11

Weaving of a glass cloth and subsequent treatment were carried out in the same manner as in Example 1, except that a glass yarn having average filament diameter: 5 μm, filament number: 100, twist number: 1.0 Z, and weight per unit length: 5.6×10⁻⁶ kg/m for the warp yarn and a glass yarn having average filament diameter: 6.0 μm, filament number: 100, twist number: 1.0 Z, and weight per unit length: 8.3×10⁻⁶ kg/m for the weft yarn were used and weaving density of the warp yarn and the weft yarn were set at 70 yarns/25 mm and 51 yarns/25 mm, respectively, to obtain glass cloth K having weight of 32 g/m² and thickness of 36 μm. Elongation percentages in the warp yarn direction and the weft yarn direction of glass cloth K at 5 N point were 0.23% and 0.25%, respectively, and a (breadth/length) ratio of an elongation percentage in the weft yarn direction to an elongation percentage in the warp yarn direction was 1.09, which showed superior isotropy.

Subsequently, preparation of substrate K and measurement of dimensional change rate were carried out in the same manner as in Example 1. Dimensional change rates of substrate K were −0.024% for the warp yarn direction and −0.029% for the weft yarn direction, and both of dimensional change rate and anisotropy between the warp yarn direction and the weft yarn direction were small.

Comparative Example 1

Weaving of a glass cloth and subsequent treatment were carried out in the same manner as in Example 1, except that a glass yarn having average filament diameter: 4 μm, filament number: 100, twist number: 1.0 Z, and weight per unit length: 3.4×10⁻⁶ kg/m was used for both of the warp yarn and the weft yarn and weaving density of the warp yarn and the weft yarn were set at 75 yarns/25 mm and 75 yarns/25 mm, respectively, to obtain glass cloth L having weight of 20 g/m² and thickness of 20 μm {(breadth/length) ratio of an average filament diameter of the weft yarn to an average filament diameter of the warp yarn=1.00}. Elongation percentages in the warp yarn direction and the weft yarn direction of glass cloth L at 5 N point were 0.19% and 0.28%, respectively, and a (breadth/length) ratio of an elongation percentage in the weft yarn direction to an elongation percentage in the warp yarn direction was 1.44, which showed that elongation percentage in the weft yarn direction was remarkably larger than that in the warp yarn direction.

Subsequently, preparation of substrate L and measurement of dimensional change rate were carried out in the same manner as in Example 1. Dimensional change rates of substrate L were −0.024% for the warp yarn direction and −0.059% for the weft yarn direction, and anisotropy between the warp yarn direction and the weft yarn direction was large.

Comparative Example 2

Weaving of a glass cloth and subsequent treatment were carried out in the same manner as in Example 1, except that a glass yarn having average filament diameter: 4.5 μm, filament number: 100, twist number: 1.0 Z, and weight per unit length: $4.2 \times 10^{-6}$ kg/m was used for both of the warp yarn and the weft yarn and weaving density of the warp yarn and the weft yarn were set at 70 yarns/25 mm and 73 yarns/25 mm, respectively, to obtain glass cloth M having weight of 24 g/m² and thickness of 26 μm {a (breadth/length) ratio of an average filament diameter of the weft yarn to an average filament diameter of the warp yarn=1.00}. Elongation percentages in the warp yarn direction and the weft yarn direction of glass cloth M at 5 N point were 0.16% and 0.29%, respectively, and a (breadth/length) ratio of an elongation percentage in the weft yarn direction to an elongation percentage in the warp yarn direction was 1.82, which showed that elongation percentage in the weft yarn direction was remarkably larger than that in the warp yarn direction.

Subsequently, preparation of substrate M and measurement of dimensional change rate were carried out in the same manner as in Example 1. Dimensional change rates of substrate M were −0.075% for the warp yarn direction and −0.068% for the weft yarn direction, and dimensional change rates were large.

Comparative Example 3

Weaving of a glass cloth and subsequent treatment were carried out in the same manner as in Example 1, except that a glass yarn having average filament diameter: 7.0 μm, filament number: 200, twist number: 1.0 Z, and weight per unit length: $22 \times 10^{-6}$ kg/m for the warp yarn and a glass yarn having average filament diameter: 9.0 μm, filament number: 200, twist number: 1.0 Z, and weight per unit length: $33 \times 10^{-6}$ kg/m for the weft yarn were used and weaving density of the warp yarn and the weft yarn were set at 60 yarns/25 mm and 52 yarns/25 mm, respectively, to obtain glass cloth N having weight of 113 g/m² and thickness of 96 μm {a (breadth/length) ratio of an average filament diameter of the weft yarn to an average filament diameter of the warp yarn=1.29, weight per unit length of both of the warp yarn and the weft yarn=over $14 \times 10^{-6}$ kg/m}. Elongation percentages in the warp yarn direction and the weft yarn direction of glass cloth N at 5 N point were 0.26% and 0.32%, respectively, and (breadth/length) ratio of elongation percentage in the weft yarn direction to elongation percentage in the warp yarn direction was 1.23, which showed that elongation percentage in the weft yarn direction was remarkably larger than that in the warp yarn direction.

Subsequently, preparation of substrate N and measurement of dimensional change rate were carried out in the same manner as in Example 1. Dimensional change rates of substrate N were −0.085% for the warp yarn direction and −0.098% for the weft yarn direction, and both of dimensional change rate and anisotropy between the warp yarn direction and the weft yarn direction were large.

INDUSTRIAL APPLICABILITY

By using the glass cloth of the present invention, a printed wiring board which has a small anisotropy in dimensional change and is free from warpage and twist can be produced.

The invention claimed is:

1. A woven glass cloth comprising:
   warp yarns; and
   weft yarns, wherein
   each of said warp yarns and weft yarns has a total fineness of $1.8 \times 10^{-6}$ kg/m to $6 \times 10^{-6}$ kg/m, a ratio of an average filament diameter of the weft yarns to an average filament diameter of the warp yarns is 1.01 or more but less than 1.20, and a thickness of the woven glass cloth is 10 μm or more but 40 μm or less.

2. The glass cloth according to claim 1, wherein a ratio of a filament number of the weft yarn to a filament number of the warp yarn is 0.8 or more but 1.2 or less.

3. The glass cloth according to claim 1, wherein a ratio of a volume of the weft yarn to a volume of the warp yarn is 0.75 or more but 1.15 or less.

4. The glass cloth according to claim 1, wherein an elongation percentage in the weft yarn direction generated when a load of 5 N per 25 mm width of glass cloth is applied in the weft yarn direction and an elongation percentage in the warp yarn direction generated when said load is applied in the warp yarn direction are both 0.25% or less, and a ratio of an elongation percentage in the weft yarn direction to an elongation percentage in the warp yarn direction is 0.5 to 1.3 (inclusive).

5. A prepreg for printed wiring board, comprising the glass cloth according to claim 1 and a matrix resin in a partially-cured state.

6. A printed wiring board prepared using the prepreg for the printed wiring board according to claim 5.

7. A prepreg for printed wiring board, comprising the glass cloth according to claim 2 and a matrix resin in a partially-cured state.

8. A prepreg for printed wiring board, comprising the glass cloth according to claim 3 and a matrix resin in a partially-cured state.

9. A prepreg for printed wiring board, comprising the glass cloth according to claim 4 and a matrix resin in a partially-cured state.

10. The glass cloth according to claim 1, wherein the thickness of the woven glass cloth is 10 μm to less than 40 μm.

\* \* \* \* \*